United States Patent [19]

Chabert

[11] Patent Number: 5,687,063
[45] Date of Patent: Nov. 11, 1997

[54] SUBRACK FOR ELECTRONIC MODULES

[75] Inventor: Jean-Marie Chabert, Valbonne, France

[73] Assignee: AEG Schneider Automation, Valbonne, France

[21] Appl. No.: 672,041

[22] Filed: Jun. 26, 1996

[30] Foreign Application Priority Data

Jun. 26, 1995 [FR] France .................. 95 07750

[51] Int. Cl.$^6$ .................. G06F 1/16; H05K 5/00
[52] U.S. Cl. .................. 361/726; 361/732
[58] Field of Search .................. 361/683, 724–727, 361/728, 729, 730, 731, 732, 796–802; 364/708.1; G06F 1/16

[56] References Cited

U.S. PATENT DOCUMENTS

| Re. 34,491 | 12/1993 | Driller et al. | 361/729 |
|---|---|---|---|
| 4,731,702 | 3/1988 | Hiatt et al. | 361/391 |
| 5,239,447 | 8/1993 | Cotues et al. | 361/744 |
| 5,297,000 | 3/1994 | Freige et al. | 361/692 |
| 5,309,323 | 5/1994 | Gray et al. | 361/726 |
| 5,420,750 | 5/1995 | Freige et al. | 361/695 |

FOREIGN PATENT DOCUMENTS

| 84 11 255 | 7/1984 | Germany . |
|---|---|---|
| 805175 | 12/1958 | United Kingdom . |

Primary Examiner—Leo P. Picard
Assistant Examiner—Lynn D. Feild
Attorney, Agent, or Firm—Oblon, Spivak, McClelland, Maier & Neustadt, P.C.

[57] ABSTRACT

Modular type subrack, in particular for programmable automatic controllers, which includes a plurality of modular compartments. Each part of the modular compartment that is not equipped with a functional module houses a dummy module that is, for example, snap-fastenable via a resilient tang to a locking member on a vertical partition of the subrack.

4 Claims, 2 Drawing Sheets

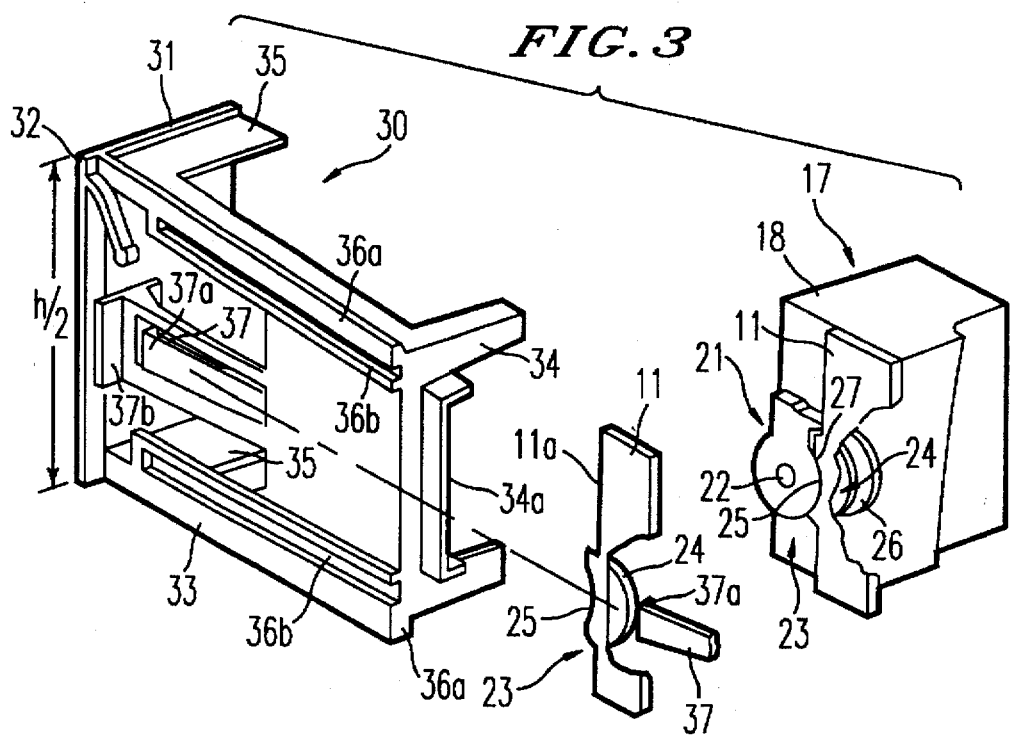
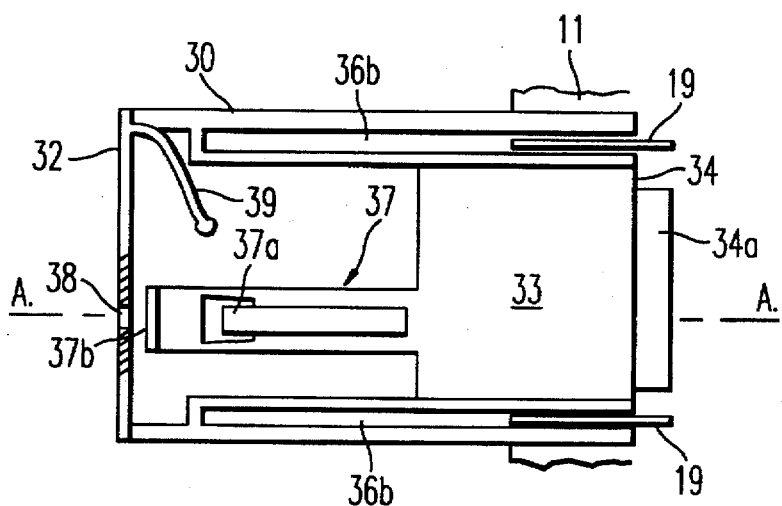
FIG. 4
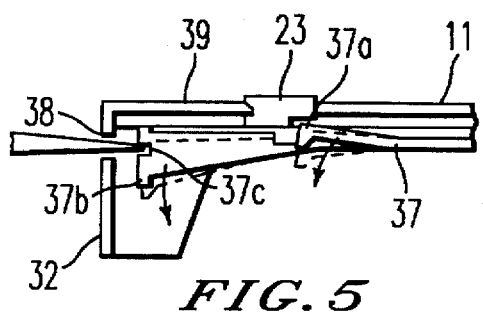
FIG. 5

SUBRACK FOR ELECTRONIC MODULES

BACKGROUND OF THE INVENTION

1. Field of the Invention

The present invention concerns a modular type subrack for an equipment comprising a certain number of electronic modules, for example a programmable automatic controller.

2. Discussion of the Background

The modular subracks designed to house electronic modules usually comprise a chassis the internal volume of which is divided into modular compartments open at the front, each compartment being adapted to house at least one functional electronic module.

Depending on the configuration appropriate to the application of the subrack, the compartments are totally or partly occupied by electronic modules. It is desirable for the open fronts of unoccupied compartments to be blanked off by low cost members that are easy to fit. It is also desirable for these members to be easily demountable in order to install in the subrack additional electronic modules complementing the initial configuration of the equipment.

If the modular compartments of the chassis are separated from each other by vertical partitions, the chassis being molded, for example, it is also necessary for the chassis to be mechanically rigid.

SUMMARY OF THE INVENTION

An object of the invention is to provide a simple way of blanking off the open sides of the compartments—or of the unoccupied parts thereof—of a subrack of the type described, and of contributing to the rigidity of the subrack.

In accordance with the invention, each modular compartment part that is not equipped with a functional module houses a dummy module the casing of which includes a vertical front wall blanking off the corresponding part of the open side of the compartment and a vertical lateral wall adjacent a vertical partition.

The vertical partitions preferably have fixed locking members, for example fixed cams, adapted to cooperate alternately with movable locking members provided on the functional modules and on the dummy modules.

The movable members in question can be pivoting levers that hook behind the fixed locking cams; to simplify the manufacture of the dummy module, a resilient snap-fastener tang that can be released by a tool inserted through an opening in the front wall of the dummy module can be used.

BRIEF DESCRIPTION OF THE DRAWINGS

The following description of one non-limiting embodiment is given with reference to the drawings in order to explain the characteristic features and the advantages of the invention.

FIG. 3 is a perspective view of a dummy module, FIG. 4 is an elevation view of the dummy module partially inserted into the corresponding compartment, FIG. 5 is a detail of FIG. 4 showing the dummy module in section on the line A—A in FIG. 4.

DESCRIPTION OF THE PREFERRED EMBODIMENT

Figure 1:
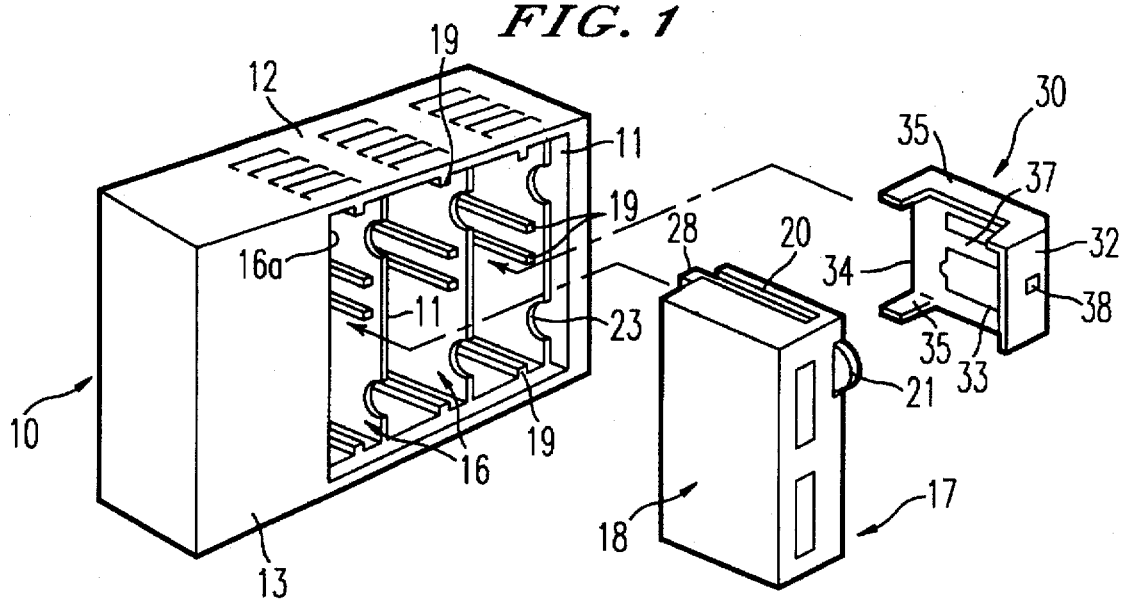
FIG. 1 is an exploded perspective view of a programmable automatic controller chassis of the invention.
Figure 2:
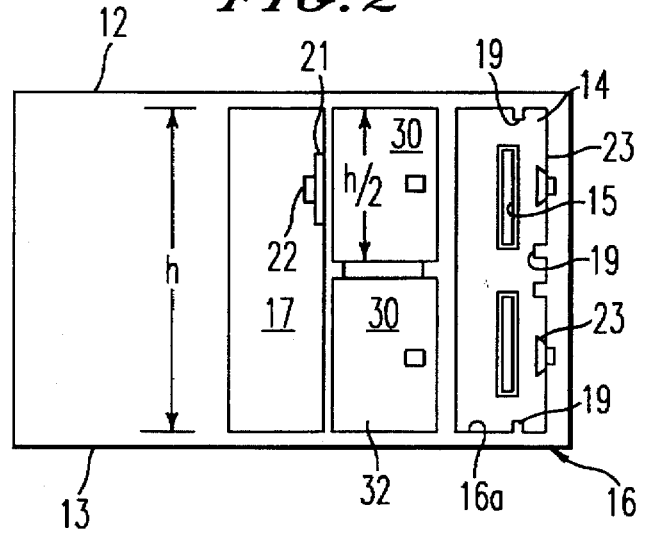
FIG. 2 is a diagrammatic front view thereof.

The programmable automatic controller shown in FIGS. 1 and 2 comprises a molded insulative material chassis 10 having vertical side partitions 11, a horizontal top wall 12 and a horizontal bottom wall 13 provided with cooling slots and a vertical rear wall 14 with openings 15 through which connectors on the rear of the modules pass.

Thus the chassis 10 defines an internal volume divided by the vertical partitions 11 into modular compartments 16 each of which is adapted to house either an active interface functional module 17 of height h or two such functional modules of height h/2. The remainder of the description refers to the latter situation.

The interface modules 17 comprises parallelepiped-shape boxes 18 inserted into the chassis 10 by means of slideways 19 in the compartments on the inside faces of the walls 12, 13 and on one side of the partitions 11 cooperating with members such as grooves 20 on the corresponding faces of the boxes. Fixing means such as a flat locking lever 21 on the side of the box 18, near the front pivot on a horizontal axis journal 22 and cooperate with a fixed locking member such as a cam 23 on the side of the partition 11, near the front. As can be seen in FIG. 3, the lever 21 cooperates with the convex and concave faces 24 and 25, respectively, of the cam through a curved hooking arm 26 and a central part 27 with a suitable profile running around the journal 22. For a better understanding of the construction and operation of this device, reference may be had to French patent application FR-94 05713 of 06.05.94. The front of the box of the interface module 17 can carry a terminal block (not shown) for connection to input and output units controlled by the automatic controller; a connector 28 at the rear of the box 17 connects to the central processor unit of the automatic controller.

The dummy module 30 includes a box 31 of height h/2 having a vertical front wall 32, a vertical side wall 33, a notched vertical rear wall 34 and horizontal flanges 35 at the top and bottom which make the box rigid and also provide openings to promote efficient circulation of air entering through the slots in the walls 12, 13.

The dummy module can be inserted into a half-compartment of the chassis in which there is no functional module by sliding top and bottom ribs 36a at the top and bottom edges of the side wall 33 and lateral grooves 36b in the same wall into the slideways 19 of the chassis. When the dummy module is fitted, its front wall 32 blanks off the open front 16a of the compartment 16. The rear wall 34 of the dummy module has a projecting part 34a which nests inside an opening 15 in the rear wall of the automatic controller chassis. FIG. 1 is an exploded view showing a large functional module 17 adapted to fit in the compartment 16 at the lefthand end of the chassis and a half-height dummy module 30 adapted to fit in a central half-compartment 16. FIG. 2 shows two dummy modules 30 housed in the same central compartment. The compartment 16 on the righthand side does not have any module in it.

The dummy module 30 is locked in position by a locking member comprising a resilient snap-fastener tang 37 which is a flexible part of the side wall 33, this wall being otherwise rigid. The tang 37 has a lip 37a that cooperates with the convex rear face 24 of the cam at the front of the partition 11. The tang ends at the front in a transverse stub 37b in which there is a notch 37c. The central part of FIG. 3 is cut away to show the lip 37a of the resilient tang of the dummy module abutted against the rear face 24 of the cam 23 associated with the partition 11 and the righthand part of FIG. 3 shows the lever 21 of a neighboring functional module 17 engaged with the cam 23 of the neighboring partition 11. The front wall 32 of the dummy module 30 has an opening 38 for inserting a tool the point of which (see FIG. 5) is inserted in the notch 37c to move the tang towards a position shown in dashed outline in which the lip is moved away from its position abutted against the cam 23, so releasing the box 31.

The box 31 is molded from a plastics material; a resilient finger 39 molded in one piece with it is provided laterally on the wall 33 to bear against the edge 11a of the partition 11 on completion of insertion of the box into the compartment. When the dummy module is in place, the resilient finger is stressed, which facilitates extraction as soon as the lip 37a is released from the cam 23.

In a more costly embodiment a locking lever similar to that of the functional electronic module could be provided on the box of the dummy module.

I claim:

1. Modular type subrack for electronic equipment, comprising:

a chassis having an internal volume which is divided into modular compartments separated by vertical partitions and having open fronts, a functional module which includes a box having at least part of a functional electronic module housed therein and which includes a mechanism fixing the module to the chassis wherein said box is positioned in at least one of said modules, wherein, a dummy module is housed in each part of the modular compartment not fitted with said functional module, the dummy module has a vertical front wall blanking off a corresponding part of an open side of the compartment and a vertical lateral wall adjacent one of said vertical partitions of the chassis;

the dummy module includes a vertical lateral wall, a guide rib substantially aligned with said vertical lateral wall and a locking member; and said front wall of the dummy module has an opening formed therein and wherein the locking member of the dummy module is positioned so as to be accessible via an unlocking tool through said opening and the front wall of the dummy module.

2. Subrack according to claim 1 wherein said functional module has a locking member and the vertical partitions have fixed locking members cooperable with said movable locking member of the functional module and with said movable locking member of the dummy module.

3. Subrack according to claim 2 wherein the locking member of the dummy module comprises a snap-fastener tang projecting from a lateral wall of the dummy module and cooperating with a locking abutment that is part of the fixed locking member provided on the wall to cooperate with said locking member of the functional module.

4. Subrack according to claim 1 wherein the dummy module comprises a molded module, the resilient snap-fastener member is molded in one piece with said lateral wall, and a resilient finger molded in one piece with the dummy module is provided on an exterior side of said lateral wall to bear against an edge of the vertical partition.

* * * * *